US008993981B2

(12) United States Patent
Notte, IV et al.

(10) Patent No.: US 8,993,981 B2
(45) Date of Patent: Mar. 31, 2015

(54) CHARGED PARTICLE SOURCE WITH LIGHT MONITORING FOR TIP TEMPERATURE DETERMINATION

(75) Inventors: John Notte, IV, Gloucester, MA (US); Randall G. Percival, Raymond, NH (US); Milton Rahman, Peabody, MA (US); Louise Barriss, North Reading, MA (US); Russell Mello, Wakefield, MA (US); Mark D. DiManna, Fremont, NH (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 13/277,583

(22) Filed: Oct. 20, 2011

(65) Prior Publication Data

US 2012/0074318 A1 Mar. 29, 2012

Related U.S. Application Data

(63) Continuation of application No. PCT/US2010/036527, filed on May 28, 2010.

(60) Provisional application No. 61/186,521, filed on Jun. 12, 2009.

(51) Int. Cl.
*H01J 27/26* (2006.01)
*H01J 37/304* (2006.01)
*G05D 23/27* (2006.01)
*H01J 37/08* (2006.01)
(Continued)

(52) U.S. Cl.
CPC .............. *G05D 23/27* (2013.01); *H01J 37/08* (2013.01); *H01J 37/22* (2013.01); *H01J 37/242* (2013.01); *H01J 37/243* (2013.01); *H01J 2237/0807* (2013.01)
USPC ..... 250/423 F; 250/306; 250/307; 250/423 R

(58) Field of Classification Search
USPC ................... 250/306, 307, 310, 423 R, 423 F
See application file for complete search history.

(56) References Cited

U.S. PATENT DOCUMENTS 3,526,799 A * 9/1970 Coppola et al. ............. 313/448
3,970,202 A 7/1976 Speggiorin et al.
(Continued)

FOREIGN PATENT DOCUMENTS

GB 1 196 103 A 6/1970
JP 63-4535 1/1988
(Continued)

OTHER PUBLICATIONS

International Search Report and Written Opinion for corresponding PCT Application No. PCT/US2010/036527, dated Sep. 3, 2010.
(Continued)

*Primary Examiner* — Brooke Purinton
(74) *Attorney, Agent, or Firm* — Fish & Richardson P.C.

(57) ABSTRACT

Systems and methods for heating an apex of a tip of a charged particle source are disclosed. The charged particle source can be, for example, a gas ion source. The systems can include a detector configured to detect light generated by the tip apex, and a controller coupled with the charged particle source and the detector so that the controller can control heating of the tip apex based on the light detected by the detector.

17 Claims, 6 Drawing Sheets

(51) Int. Cl.
*H01J 37/22* (2006.01)
*H01J 37/24* (2006.01)

(56) References Cited

U.S. PATENT DOCUMENTS

| | | | |
|---|---|---|---|
| 5,055,696 A * | 10/1991 | Haraichi et al. | 250/492.2 |
| 7,888,654 B2 * | 2/2011 | Tessner et al. | 250/423 F |
| 2002/0130262 A1 * | 9/2002 | Nakasuji et al. | 250/311 |
| 2002/0195570 A1 * | 12/2002 | Howard et al. | 250/427 |
| 2003/0010911 A1 * | 1/2003 | Palmer et al. | 250/306 |
| 2007/0158558 A1 | 7/2007 | Ward et al. | |
| 2007/0221843 A1 * | 9/2007 | Ward et al. | 250/309 |
| 2008/0032295 A1 * | 2/2008 | Toumazou et al. | 435/6 |
| 2009/0121160 A1 | 5/2009 | Winkler et al. | |
| 2010/0108902 A1 * | 5/2010 | Frosien et al. | 250/396 R |

FOREIGN PATENT DOCUMENTS

| | | |
|---|---|---|
| JP | H05-82061 | 4/1993 |
| JP | 2001-351799 | 12/2001 |
| JP | 2006-134664 | 5/2006 |
| JP | 2009-050486 | 3/2009 |
| JP | 2009-123683 | 6/2009 |
| TW | 200634884 A | 10/2006 |

OTHER PUBLICATIONS

Islam et al., "Digital control system for the thermionic cathode in an electron gun," Proc. of Southeast Conf., pp. 720-723, Apr. 1992.
International Preliminary Report on Patentability for corresponding PCT Application No. PCT/US2010/036527, dated Dec. 22, 2011.
European search report for corresponding EP Appl No. 10 737 667.5-1802, dated Jul. 1, 2013.
Japanese Office Action, with translation thereof, for corresponding JP Appl No. 2012-514989, dated Jan. 7, 2014.
Taiwan Office Action, with translation thereof, for TW Appl No. 099118668, dated Aug. 5, 2014.

* cited by examiner

CHARGED PARTICLE SOURCE WITH LIGHT MONITORING FOR TIP TEMPERATURE DETERMINATION

CROSS-REFERENCE TO RELATED APPLICATIONS

This application is a continuation of, and claims priority under 35 U.S.C. §120, to international application PCT/US2010/036527, filed May 28, 2010, which claims priority under 35 U.S.C. §119(e)(1) to U.S. Provisional Application No. 61/186,521, filed Jun. 12, 2009. The contents of both of these applications are hereby incorporated by reference in their entirety.

FIELD

The disclosure generally relates to systems and methods for heating a tip apex of a charged particle source, such as the tip apex of a gas field ion source.

BACKGROUND

Charged particles, such as electrons and ions, can be used to investigate and/or modify a sample, such as a semiconductor sample. Such electrons can be generated, for example, in a scanning electron microscope, and such ions can be generated, for example, in a gas field ion microscope.

SUMMARY

It is often desirable to heat the tip apex of a charged particle source, such as the tip apex of an ion source of a gas field ion microscope, during formation of the tip apex. In many instances, it is advantageous to control the temperature of the tip apex within a certain range, such as, for example +/−100K or less of a target temperature. Applicants have discovered that, in certain cases where a resistive heating system (e.g., resistive heater wire) is used to heat the tip apex, it can be difficult to reliably predict how much current desirably passes through the resistive heating system, how much voltage to apply across the resistive heating system, and/or how much power to supply to the resistive heating system to ensure that the tip apex is heated to within the desired range of temperatures. Applicants have also discovered that the temperature of the tip apex corresponds to the amount of light emitted by the tip apex in a relatively reliable and reproducible fashion. Further, the amount of light emitted by the tip apex can be very sensitive to temperature so that minor variations in the tip apex temperature can be detected with relatively high sensitivity. As a result, Applicants provide herein various systems and methods designed to use the light emitted by a heated tip apex as a basis for controlling the temperature of the tip apex to within a desired temperature range. Such systems and methods can be used during initial tip apex formation and/or during re-formation of a tip apex. Further, such systems can lend themselves quite nicely to automation, and/or can be utilized in a relatively low cost manner.

In one aspect, the disclosure generally provides a system that includes a charged particle source, a detector and a controller. The charged particle source includes a tip having a tip apex. The tip apex is configured to emit charged particles during use of the charged particle source, and the tip apex is capable of generating light when heated. The detector is configured to detect light generated by the tip apex. The controller is coupled with the charged particle source and the detector so that the controller can control heating of the tip apex based on the light detected by the detector.

In another aspect, the disclosure generally provides a method that includes heating a tip apex of a tip of a charged particle source; detecting light generated by the tip apex while the tip apex is heated; and determining whether to change the heat delivered to the tip apex based on the detected light.

Optionally, embodiments can include one or more of the following features.

The system can be a gas field ion microscope.

The charged particle source can an ion source, such as, for example, a gas field ion source.

The charged particle source can be an electron source.

The detector can be a photon detector.

The detector can be a photodiode, a photodetector, a photomultiplier tube, a camera, a CMOS device, a charge coupled device or other light sensitive sensor.

The light generated by the tip apex can propagate along an optical axis, and the detector is disposed along the optical axis or the detector can be off of the optical axis.

The system can further include an optical device, and the light can interact with the optical device before being detected by the detector. The optical device can direct the light to the detector. Examples of optical devices include mirrors, lenses (e.g., collimating lenses), optical filters and windows.

The light can pass through an aperture before reaching the detector.

The system can further include a power supply coupled to a resistive heating system that is configured to heat the tip apex when the resistive heating arrangement is heated. The power supply can be, for example, a power regulated power supply, a voltage regulated power supply, or a current regulated power supply.

The system can further include a power supply and a resistive heating system, where the power supply can produce an electrical current in the resistive heating system, the electrical current can heat the resistive heating system, and the tip apex is heated when the resistive heating system is heated.

The resistive heating system can include a wire. The system can further include at least one sensor (e.g., a voltage sensor configured to measure a voltage across the wire, a current sensor configured to measure an electrical current flowing through the wire).

The system can further include a heat source configured to heat the tip apex. Examples of heat sources include lasers and electron sources. The heat source can be configured to provide at least two Watts of heating power to the tip.

The method can further include changing the heat delivered to the tip apex based on an amount of detected light.

The can further include changing the temperature of the tip apex in proportion to an amount of detected light.

The can further include determining whether to change the heat delivered to the tip apex comprises comparing an amount of the detected light to an amount of light expected to be detected at a desired temperature of the tip apex.

The method can further include using the comparison to change the heat delivered to the tip apex. The heat delivered to the tip apex can be changed if the comparison indicates that a differential between a first temperature and a second temperature is greater than a predetermined value, where the first temperature is a temperature of the tip apex based on the detected light, and the second of the tip apex is a desired temperature of the tip apex. The predetermined value can be, for example, 10K, 25K, 50K or 100K.

The heat delivered to the tip apex can be unchanged if the comparison indicates that a differential between a first temperature and a second temperature is less than a predetermined value, the first temperature is a temperature of the tip apex based on the detected light, and the second of the tip apex is a desired temperature of the tip apex. The predetermined value can be, for example, 10K, 25K, 50K or 100K.

Determining whether to change the heat delivered to the tip apex can include determining an integral of a differential between a first temperature and a second temperature, where the first temperature is a temperature of the tip apex based on the detected light, and the second of the tip apex is a desired temperature of the tip apex.

Determining whether to change the heat delivered to the tip apex can include determining a proportion of a differential between a first temperature and a second temperature, where the first temperature is a temperature of the tip apex based on the detected light, and the second of the tip apex is a desired temperature of the tip apex.

Determining whether to change the heat delivered to the tip apex can include determining a derivative of a differential between a first temperature and a second temperature, where the first temperature is a temperature of the tip apex based on the detected light, and the second of the tip apex is a desired temperature of the tip apex.

Determining whether to change the heat delivered to the tip apex comprises determining at least two parameters. The at least two parameters can include an integral of a differential between a first temperature and a second temperature, a derivative of the differential between the first and second temperatures, and a proportion of the differential between the first and second temperatures. The first temperature can a temperature of the tip apex based on the detected light, and the second of the tip apex can be a desired temperature of the tip apex The temperature of the tip apex can be heated to at least 900K and/or at most 1700K.

The temperature of the tip apex is heated to at most 1700K.

Other features and advantages will be apparent from the description, drawings, and claims.

DETAILED DESCRIPTION

Figure 1:
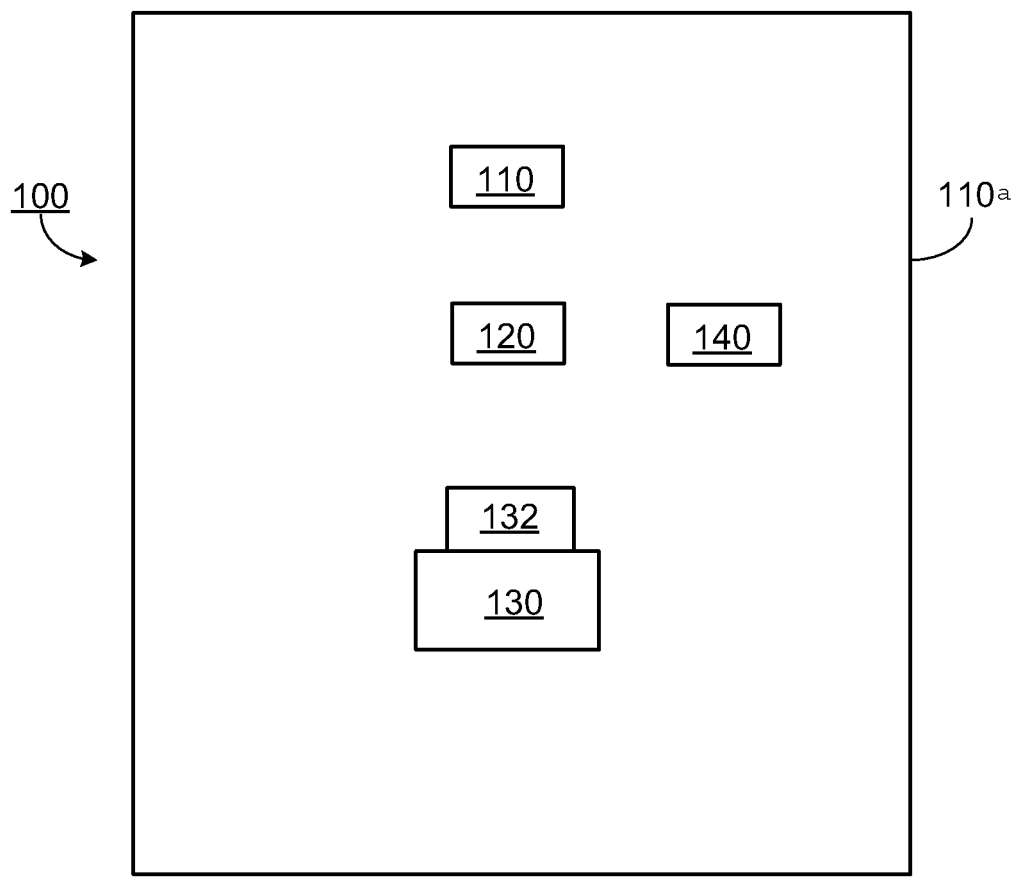
FIG. 1 is a schematic representation of a gas field ion microscope system.
Figure 2:
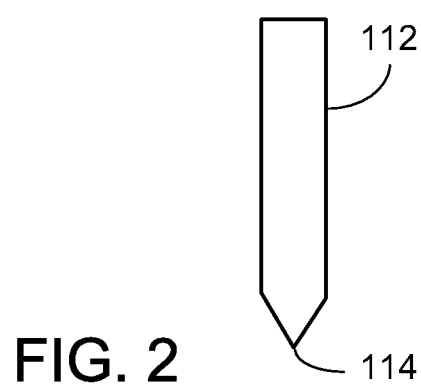
FIG. 2 is a schematic representation of a tip of a gas field ion source.

FIG. 1 shows a gas field ion microscope system 100 that includes a housing 110, a gas field ion source 110, an ion column 120, a sample holder 130, a sample 132 attached to a sample holder 130, and a detector 140. FIG. 2 shows a tip 112 of gas field ion source 110. Tip 112 has an apex 114. During use of system 100, ions emitted by tip apex 114 pass through ion column 120 and interact with sample 132. Particles generated via the interaction of the ions with sample 132 are detected by detector 140. Alternatively or additionally, the ions generated by ion source 1110 can be used in processes to modify sample 132. Various aspects of the design, manufacture and use of gas field ion microscopes are disclosed, for example, in US 2007-0158558, which is hereby incorporated by reference in its entirety.

As discussed in more detail below, there are a variety of materials from which tip 112 can be formed, and there also various shapes that tip apex 114 can possibly have. As an example, in some embodiments, tip 112 is formed of tungsten (W), and tip apex 114 has a terminal shelf that is a W(111) trimer. In general, the quality of the ion beam formed by ion source 110 depends in part on the shape of tip apex 114. Often, after using tip 112 for a period of time, the quality of the ion beam can decrease due to deformation of tip apex 114, making it desirable to re-form the tip apex 114 to a shape that will provide desired improvements to the ion beam properties. In general, as discussed in more detail below, re-forming tip apex 114 includes heating tip apex 114 to one or more elevated temperatures for one or more periods of time. In addition, the initial formation of tip apex 114 (the formation of tip apex 114 prior to its use in system 100) usually involves heating to one or more elevated temperatures.

Figure 3A:
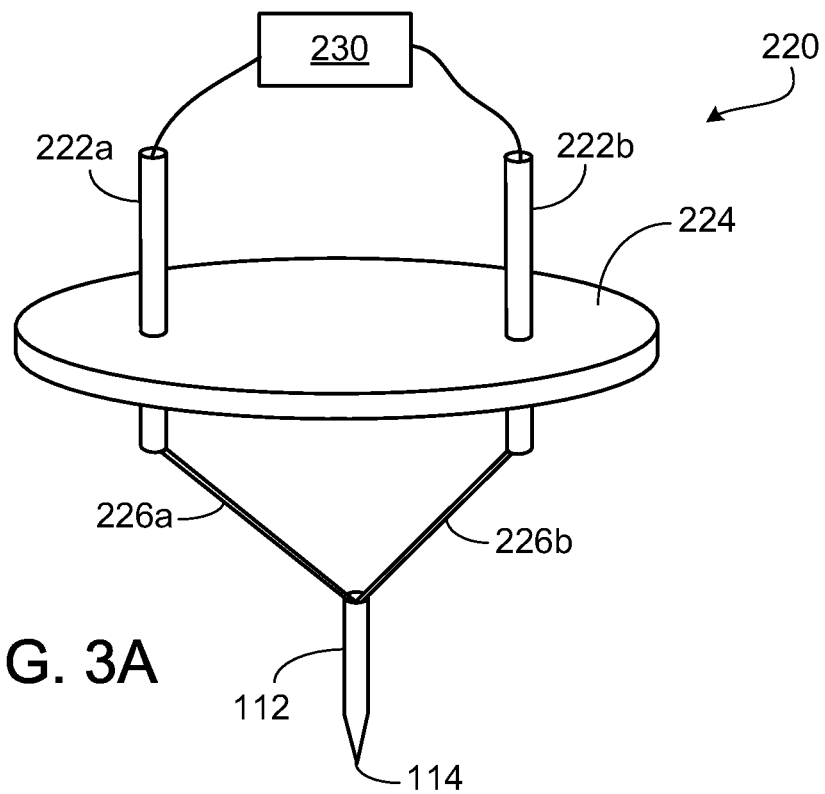
FIGS. 3A and 3B are perspective and bottom views, respectively, a support assembly for a tip.
Figure 3B:
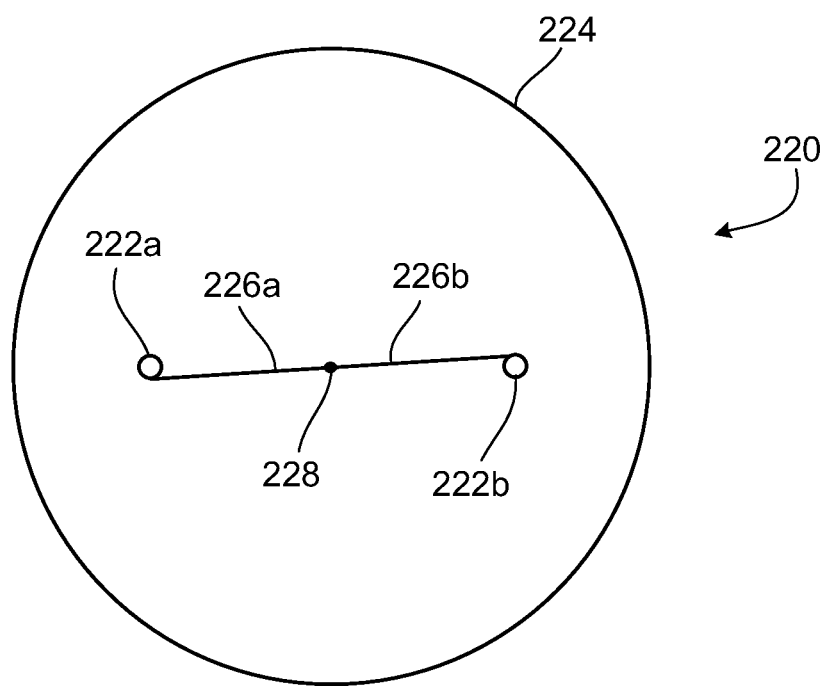

FIGS. 3A and 3B show perspective and bottom views, respectively, of a support assembly 220 that can be used to heat tip apex 114. Support assembly 220 includes support posts 222a and 222b connected to a support base 224. Posts 222a and 222b are connected to a heater wire having sections 226a and 226b that form a V-shape, which are connected to tip 112 (e.g., via welding). Posts 222a and 222b, which are formed of an electrically conductive material, are connected to a power supply 230. Power supply 230 is used to provide a current to heater wire sections 226a and 226b, causing them to generate heat. This heat is used to increase and/or control the temperature of tip apex 114.

Applicants discovered that in a given system it can be difficult to reliably predict how much electrical current should flow through heater wire sections 226a and 226b to achieve and/or maintain a desired temperature for tip apex 114, that it can be difficult to reliably predict what voltage to apply across wire sections 226a and 226b to achieve and/or maintain a desired temperature of tip apex 114, and that it can be difficult to reliably predict how much power the power supply 230 should supply to wire sections 226a and 226b to achieve and/or maintain a desired temperature for tip apex 114. In the case of attempting to correlate current through wire sections 226a and 226b with the temperature of tip apex 114, without wishing to be bound by theory, it is believed that the temperature of tip apex 114 can be very sensitive to the current through wire sections 226a and 226b, and that relatively small changes in the contact resistance and/or the temperature of wire sections 226a and 226b can change the current in wire sections 226a and 226b, resulting in a variation in the temperature of tip apex 114. It is further believed that, because wire sections 226a and 226b are formed of resistive materials and the resistivity of such materials can change (e.g., increase) as their temperature changes (e.g., increases), the amount of heat generated by wire sections 226a and 226b depends on their temperature, and often increases as their temperature increases. In the case of attempting to correlate voltage across wire sections 226a and 226b with the temperature of tip apex 114, without wishing to be bound by theory, it is believed that changes in the contact resistance and/or lead wires can make it difficult to reproducibly correlate the temperature of tip apex 114 with the voltage across wire sections 226a and 226b. Further it is to be noted that, in some systems, applying a constant voltage can make the temperature droop over time. In the case of attempting to correlate power supplied to wire sections 226a and 226b with the temperature of tip apex 114, without wishing to be bound by theory, it is believed that changes in the contact resistance and/or lead wires can make it difficult to reproducibly correlate the temperature of tip apex 114 with the power supplied to wire sections 226a and 226b. Also, for fixed power supply settings (voltage, current, or power), the tip temperature can vary due to the inconsistency over time of the resistance of the lead wires which connect power supply 230 to assembly 220. Also, for fixed power supply settings (voltage, current, or power), the tip temperature can vary due to the inconsistency over time of the thermal contact between assembly 220 and housing 110 which can serve as a heat sink. Also, for fixed power supply settings (voltage, current, or power), the tip temperature can vary due inaccuracies of power supply 230 which may depend upon the operational history of the supply, aging of components, or ambient conditions such as temperature.

Applicants provide herein systems and methods that use a novel approach to monitoring and/or controlling the temperature of tip apex 114. In general, the systems and methods involving determining the temperature of tip apex 114 by measuring the light emitted by tip apex 114 as it is heated, and comparing this temperature to a desired temperature for tip apex 114. This comparison is used to determine whether (and to what extent) to modify power supply 230, which will modify the electrical current through wire sections 226a and 226b, thereby changing the temperature of tip apex 114 to bring it closer to the desired temperature for tip apex 114.

Figure 4:
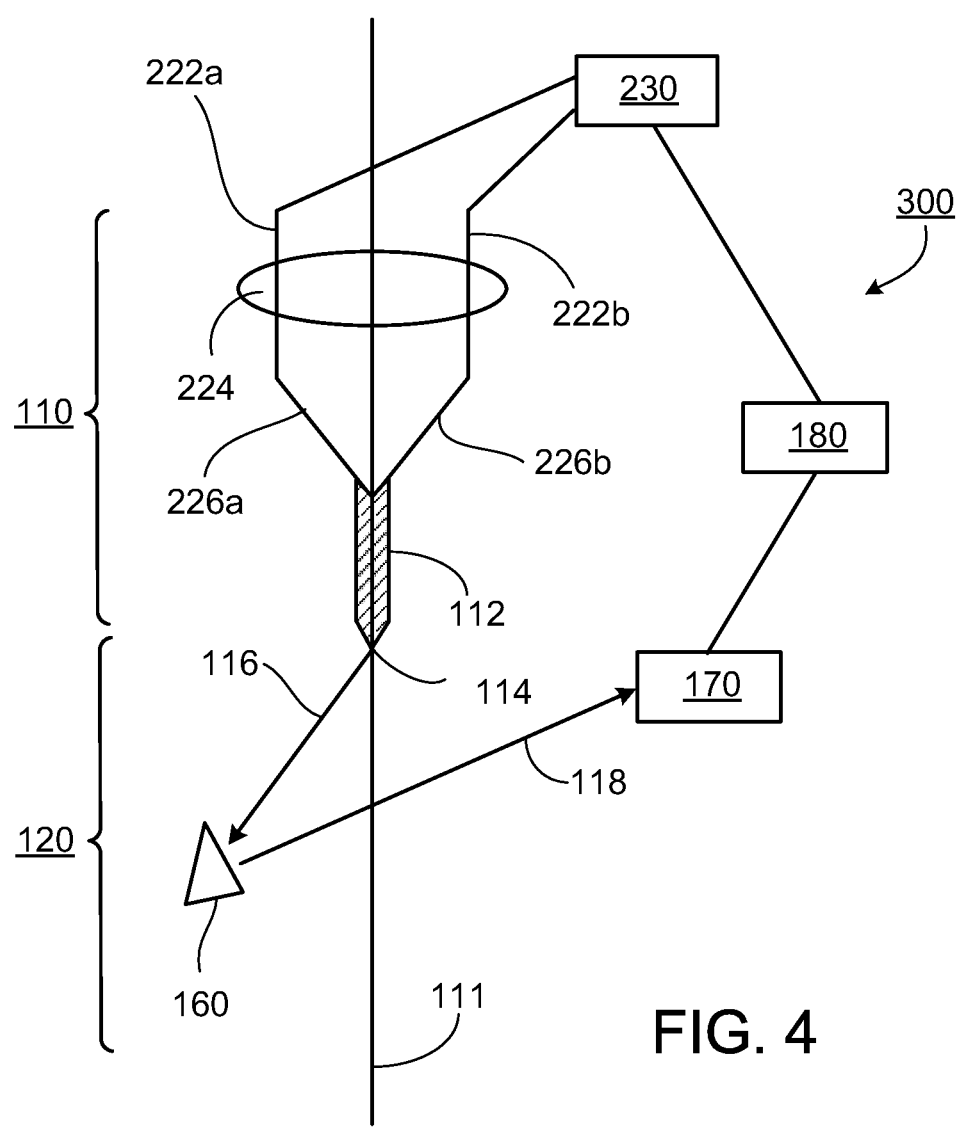
FIG. 4 is a schematic representation of a system in accordance with the disclosure.

FIG. 4 shows an embodiment of a gas field ion microscope 300 that includes a mirror 160, a photon detector 170 and a controller 180. Although, mirror 160 may be generally selected based on its reflective properties, in some cases it may also be desirable to consider other factors when selecting mirror 160. For example, it may be advantageous to select a mirror that has little or no glass (e.g., a purely metallic mirror, which can optionally be highly polished) to reduce the possibility that an insulator present in the system will undesirably impact the ion beam. Mirror 160 is set off-axis relative to an optical axis 111 of an ion beam generated by tip apex 114 when source 110 is used to generate the ion beam. Mirror 160 is oriented so that it can reflect the light 116 generated by tip apex 114 when tip apex 114 is heated, and so that the reflected light 118 is directed to detector 170 where it is detected by detector 170. Detector 170 may be selected based on the wavelengths of light emitted by tip apex 114 during heating. These wavelengths of light can depend, for example, on the material from which tip apex is formed and/or the temperature to which tip apex 114 is heated. Exemplary detectors include photodiodes, photodetectors, photomultiplier tubes, cameras, CMOS devices, and charge coupled devices. A controller 180 receives a signal from detector 170 that corresponds to the amount of light detected by detector 170, and controller 180 uses this signal to determine whether and to what extent power supply 230 should be adjusted.

An exemplary process for using system 300 is as follows. Initially, power supply 230 is used to provide an electrical current through wire sections 226a and 226b. The initial parameters (voltage across wire sections 226a and 226b, current through wire sections 226a and 226b, power supplied to wire sections 226a and 226b) can be based, for example, on general experience with other tips made of the same or similar materials. The electrical current passing through wire sections 226a and 226b heats wire sections 226a and 226b, and this, in turn, heats tip apex 114. As the temperature of tip apex 114 increases, tip apex emits light 116, which is reflected by mirror 160 to provide reflected light 118 which is detected by detector 170. A signal corresponding to the amount of light detected by detector 170 is sent to controller 180. Based on this signal, controller 180 determines whether and to what extent an adjustment (e.g., increasing/decreasing the current through wire sections 226a and 226b, increasing/decreasing the voltage across wire sections 226a and 226b, increasing/decreasing the power supplied by power supply 230 to wire sections 226a and 226b) should be made to power supply 230.

The amount by which controller 180 adjusts power supply 230 can be determined by comparing the signal from detector 170, which corresponds to the amount of detected light, to a lookup table stored in software associated with controller 180. The lookup table can be prepared, for example, based on a measurement of the amount of light emitted from a wire formed of the same material as tip 116 and detected by detector 170 as a function of the temperature of tip while simultaneously measuring the tip temperature (e.g., with a pyrometer). Advantageously, for a given tip material and system arrangement, it may be possible to make this measurement a single time only so that the same lookup table may be used repeatedly when initially forming and/or re-forming a tip apex of a given tip, and/or when forming and/or re-forming tip apexes for various. This can substantially reduce the cost associated with using a gas field ion system. Additionally or alternatively, this can substantially enhance the ability to use a gas field ion system in an automated process, such as, for example, high throughput sample inspection (e.g., in semiconductor chip fabrication).

The comparison of the signal from detector 170 to the expected signal provided in the lookup table for the desired temperature of tip apex 114 determines whether the temperature of tip apex should be increased, decreased or maintained. Controller 180 then adjusts power supply 230 accordingly. As an example, if the signal comparison indicates that the temperature of tip apex 114 is too low, controller 180 can adjust power supply 230 to increase the electrical current through wire sections 226a and 226b. As another example, if the signal comparison indicates that the temperature of tip apex 114 is too high, controller 180 can adjust power supply 230 to decrease the electrical current through wire sections 226a and 226b.

In some embodiments, controller 180 can adjust power supply 230 in proportion to the difference between the measured and desired tip temperatures. In some cases, however, there may be concern about overshooting or undershooting the desired temperature of tip apex 114. That is, in the process of trying to get tip apex 114 to the desired temperature, the actual temperature of tip apex 114 may go too high (when trying to increase the temperature of tip apex 114) or too low (when trying to decrease the temperature of tip apex 114). Accordingly, in certain embodiments, the amount by which controller 180 adjusts power supply 230 can be modulated by information in addition to the difference between the signal from detector 170 and the expected signal in the lookup table. As an example, in certain embodiments, the integral of the difference between these signals over a predetermined period of time can be taken into consideration when controller 180 adjusts power supply 230. As another example, the derivative of the signal difference can be taken into consideration when controller 180 adjusts power supply 230. As a further example, controller 180 may make no adjustment to power supply 230 (to try to substantially maintain the temperature of tip apex 114) if the difference between the signals corresponds to the tip apex 114 being within a predetermined amount (e.g., 100K, 50K, 25K, 10K) of the desired temperature.

In general, the process of monitoring/adjusting the temperature of apex tip 114 can be carried out until the desired apex structure (e.g., W(111) trimer) is achieved. In many cases, recipes may be used when preparing a tip apex. Such recipes can include, for example, multiple different steps in which the tip apex is heated to within various temperature ranges for desired periods of time. In some embodiments, the tip apex may be heated to a temperature of at least 900 K (e.g., at least 1000K, at least 1100K), and/or at most 1700K (e.g., at most 1600K, at most 1500K). Exemplary temperature ranges include 1000K to 1100K, 1100K to 1200K, 1200K to 1300K, 1300K to 1400K, 1400K to 1500K, and 1500K to 1600K. In certain embodiments, the tip apex may be heated to a particular desired temperature or temperature range for at least 30 seconds (e.g., at least one minute, at least two minutes), and/or at most 30 minutes (e.g., at most 15 minutes, at most seven minutes). Optionally, a field may be applied to the tip apex during one or more of the heating steps, and/or the tip apex may be exposed to a predetermined amount of one or more gases (e.g., molecular nitrogen, molecular oxygen, tungsten hexacarbonyl) during one or more of the heating steps. The particular recipe used may vary, for example, depending on the material from which the tip is formed and/or the desired final shape of the tip apex.

Figure 5:
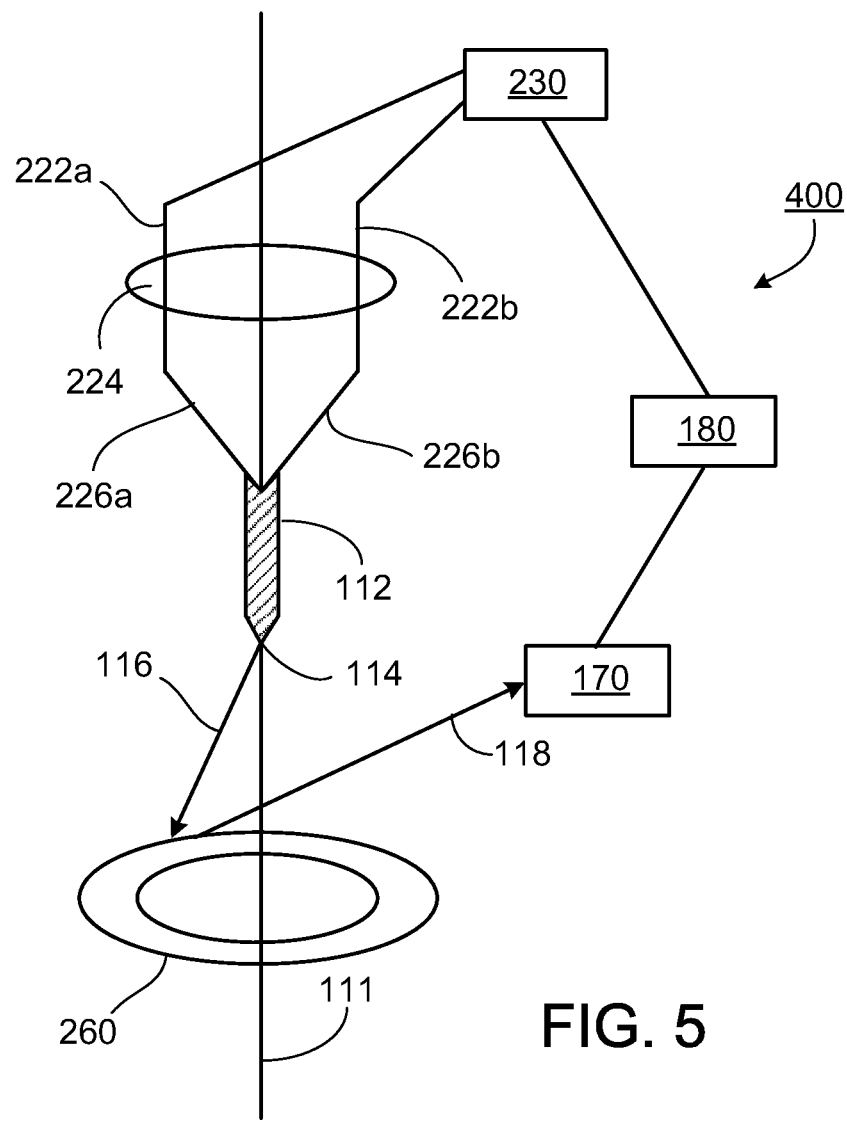
FIG. 5 is a schematic representation of a system in accordance with the disclosure.

FIG. 5 shows an embodiment of a gas field ion microscope 400 that includes a mirror 260 that is disposed along ion beam axis 111. Mirror 260 may in general be selected based on considerations as discussed above with regard to mirror 160. Mirror 260 is shaped as an annulus such that it can provide reflected light 118 when tip apex 114 is heated, but also such that it does not substantially interfere with the ion beam as it travels through ion optics 120. While shown as being in the shape of an annulus, mirror 260 could be in other shapes. As an example, mirror 260 could be wedge-shaped having a hole therethrough.

Figure 6:
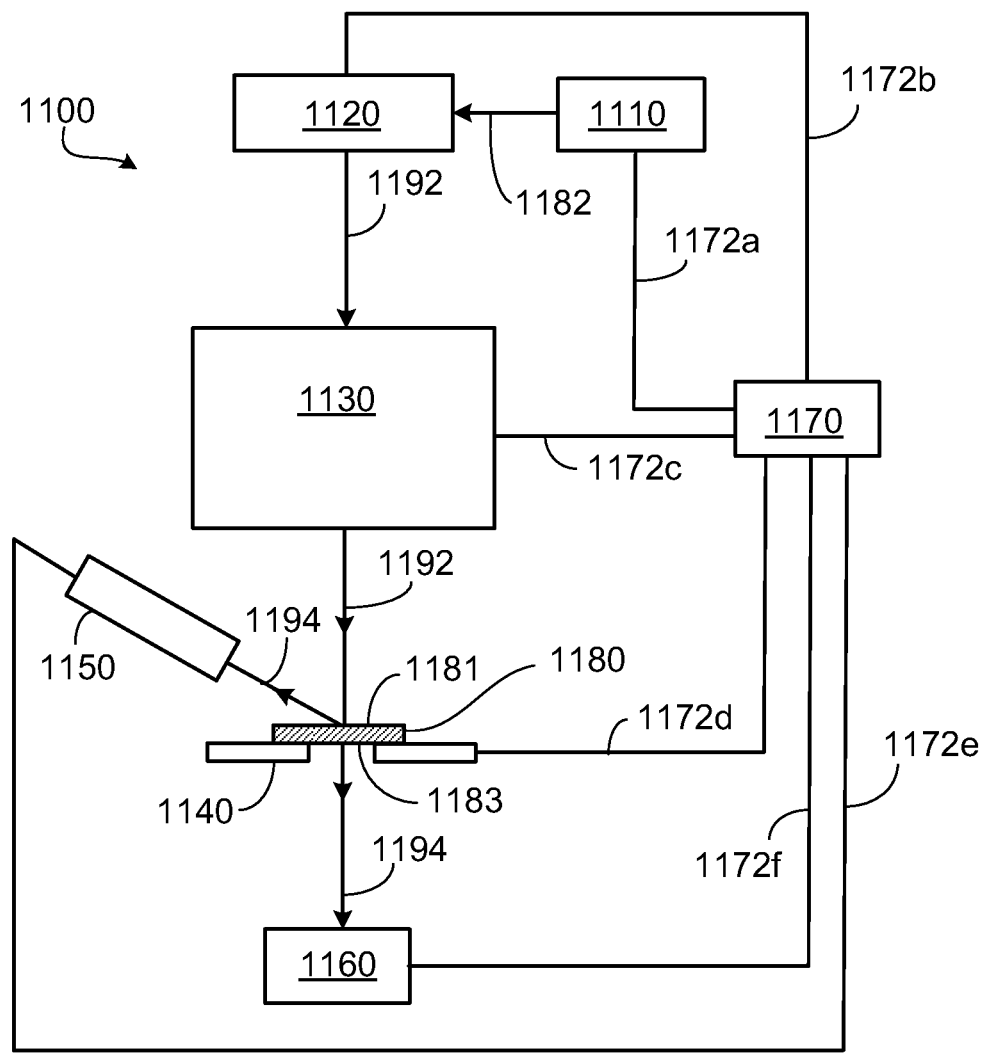
FIG. 6 is schematic diagram of an ion microscope system.
Figure 7:
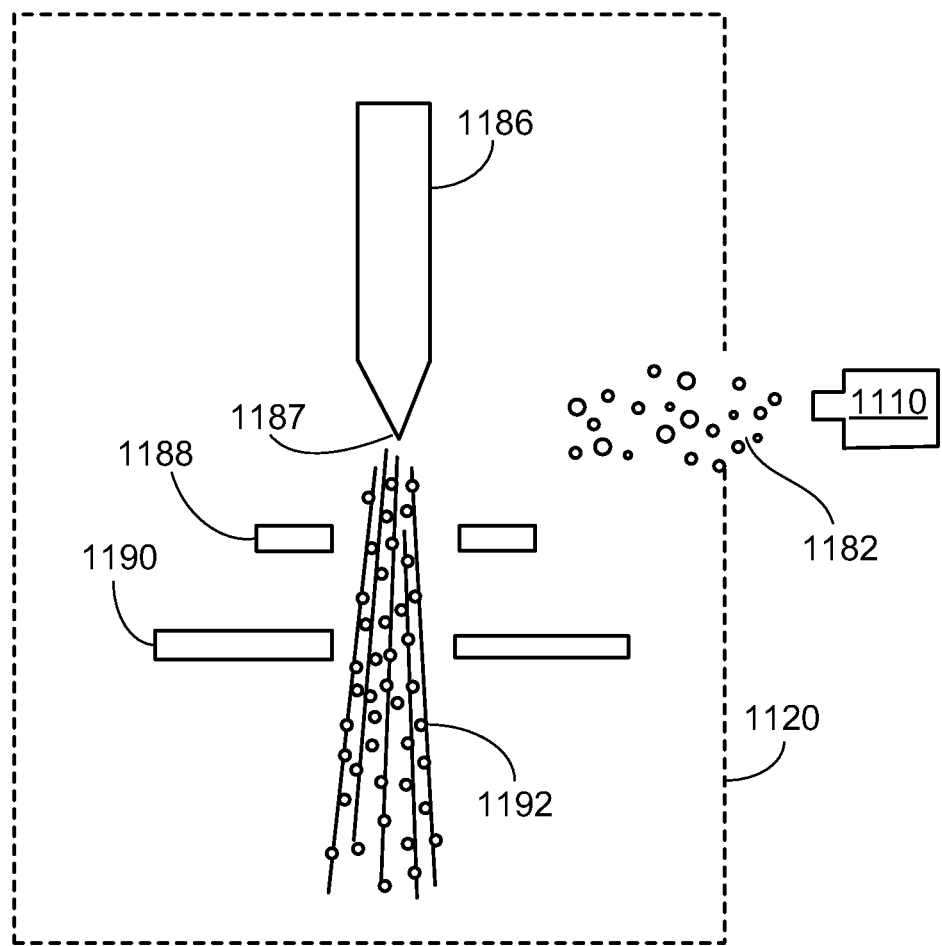
FIG. 7 is a schematic diagram of a gas field ion source.

While FIG. 1 shows a highly schematic representation of a gas field ion microscope system, FIG. 6 shows a schematic, but somewhat more detailed, representation of a gas field ion microscope system 1100 that includes a gas source 1110, a gas field ion source 1120, ion optics 1130, a sample manipulator 1140, a front-side detector 1150, a back-side detector 1160, and an electronic control system 1170 (e.g., an electronic processor, such as a computer) electrically connected to various components of system 1100 via communication lines 1172a-1172f. A sample 1180 is positioned in/on sample manipulator 1140 between ion optics 1130 and detectors 1150, 1160. During use, an ion beam 1192 is directed through ion optics 1130 to a surface 1181 of sample 1180, and particles 1194 resulting from the interaction of ion beam 1192 with sample 1180 are measured by detectors 1150 and/or 1160. In general, it is desirable to reduce the presence of certain undesirable chemical species in system 100 by evacuating the system. As shown in FIG. 7, gas source 1110 is configured to supply one or more gases (e.g., He, Ne, Ar, Kr, Xe) 1182 to gas field ion source 1120. Gas field ion source 1120 is configured to receive the one or more gases 1182 from gas source 1110 and to produce gas ions from gas(es) 1182. Gas field ion source 1120 includes a tip 1186 with a tip apex 1187, an extractor 1190 and optionally a suppressor 1188. During use, tip 1186 is biased positively with respect to extractor 1190, extractor 1190 is negatively or positively biased with respect to an external ground, and optional suppressor 1188 is biased positively or negatively with respect to tip 1186. With this configuration, un-ionized gas atoms 1182 supplied by gas source 1110 are ionized and become positively-charged ions in the vicinity of tip apex 1187. The positively-charged ions are simultaneously repelled by positively charged tip 1186 and attracted by negatively charged extractor 1190 such that the positively-charged ions are directed from tip 1186 into ion optics 1130 as ion beam 1192.

Suppressor 1188 assists in controlling the overall electric field between tip 1186 and extractor 1190 and, therefore, the trajectories of the positively-charged ions from tip 1186 to ion optics 1130. In general, the overall electric field between tip 1186 and extractor 1190 can be adjusted to control the rate at which positively-charged ions are produced at tip apex 1187, and the efficiency with which the positively-charged ions are transported from tip 1186 to ion optics 1130. In general, ion optics 1130 are configured to direct ion beam 1192 onto surface 1181 of sample 1180. Ion optics 1130 can, for example, focus, collimate, deflect, accelerate, and/or decelerate ions in beam 1192. Ion optics 1130 can also allow only a portion of the ions in ion beam 1192 to pass through ion optics 1130. Generally, ion optics 1130 include a variety of electrostatic and other ion optical elements that are configured as desired. By manipulating the electric field strengths of one or more components (e.g., electrostatic deflectors) in ion optics 1130, He ion beam 1192 can be scanned across surface 1181 of sample 1180. For example, ion optics 1130 can include two deflectors that deflect ion beam 1192 in two orthogonal directions. The deflectors can have varying electric field strengths such that ion beam 1192 is rastered across a region of surface 1181. When ion beam 1192 impinges on sample 1180, a variety of different types of particles 1194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 1150 and 1160 are positioned and configured to each measure one or more different types of particles resulting from the interaction between He ion beam 1192 and sample 1180. As shown in FIG. 6, detector 1150 is positioned to detect particles 1194 that originate primarily from surface 1181 of sample 1180, and detector 1160 is positioned to detect particles 1194 that emerge primarily from surface 1183 of sample 1180 (e.g., transmitted particles). In general, a wide variety of different detectors can be employed in microscope system 1100 to detect different particles, and a microscope system 1100 can typically include any desired number of detectors. The configuration of the various detector(s) can be selected in accordance with particles to be measured and the measurement conditions. Generally, the information measured by the detectors is used to determine information about sample 1180. Typically, this information is determined by obtaining one or more images of sample 1180. The operation of microscope system 1100 is generally controlled via electronic control system 1170. For example, electronic control system 1170 can be configured to control the gas(es) supplied by gas source 1110, the temperature of tip 1186, the electrical potential of tip 1186, the electrical potential of extractor 1190, the electrical potential of suppressor 1188, the settings of the components of ion optics 1130, the position of sample manipulator 1140, and/or the location and settings of detectors 1150 and 1160. Control system 1170 can also be used in the manner described above with regard to controller 180. Optionally, one or more of these parameters may be manually controlled (e.g., via a user interface integral with electronic control system 1170). Additionally or alternatively, electronic control system 1170 can be used (e.g., via an electronic processor, such as a computer) to analyze the information collected by detectors 1150 and 1160 and to provide information about sample 1180, which can optionally be in the form of an image, a graph, a table, a spreadsheet, or the like. Typically, electronic control system 1170 includes a user interface that features a display or other kind of output device, an input device, and a storage medium.

While certain embodiments have been described, other embodiments are possible.

As an example, while embodiments have been described that include a stationary mirror, in some embodiments, the mirror can move. For example, the mirror may have a first position in which it reflects light to the detector when the tip apex is heated, and a second position in which it does not. The first position may be one in which the mirror would substantially interfere with the ion beam path if the ion source were producing an ion beam. The second position may be one in which the mirror would not reflect light emitted by the tip apex is the tip apex were being heated. Optionally, movement of the mirror between the first and second positions may be motorized.

As another example, while embodiments have been described in which light is reflected from the mirror to the detector without interruption, in certain embodiments, one or more additional optical elements may be disposed along the light path between the detector and the mirror that initially reflects the light emitted by the apex. Such optical elements can include lenses (e.g., collimating lenses), mirrors and/or filters (e.g., wavelength selective filters). Various combinations of one or more of the same optical elements may be used, and various combinations of different optical elements can be used.

As still another example, in some embodiments, the light may pass through one or more apertures before interacting with the mirror, after interacting with the mirror, or both.

As a further example, while embodiments have been disclosed in which a mirror is used to reflect light emitted by a heated tip apex, some embodiments are designed without such a mirror. For example, a system can be designed such that the detector is in the direct line of sight of the light emitted by the heated apex. Optionally, a window can positioned in the system (e.g., in the housing wall) to allow such a direct line of sight between the apex tip and the detector. Typically, such a window would form a good seal so that it would not substantially interfere with obtaining a desired vacuum level within the system. In some cases, it may be desirable to include one or more collimating optical elements (e.g., one or more collimating lenses) between the tip apex and the detector along the light path. Other optical elements, such as, for example, one or more filters (e.g., one or more wavelength selective filters) may be present between the tip apex and the detector along the light path.

As an additional example, while embodiments have been described in which resistive heating of wire is used to heat a tip apex, other approaches to heating the tip apex may be used. In some embodiments, an appropriate positioned laser (e.g., such that the laser beam impinges on the tip, causing heat to be distributed to the tip apex) can be used to heat the tip apex. In certain embodiments, an appropriate charged particle source (e.g., such that the charged particle beam impinges on the tip, causing heat to be distributed to the tip apex) can be used to heat the tip apex. Examples of charged particle beams include ion beams and electron beams. In general, such embodiments would involve connecting the laser or charged particle source to a controller in a fashion similar to that discussed above, such that the controller can control the output of the laser or charged particle source to modify and/or control the tip apex temperature based on a comparison of the signal generated by the detector with an expected signal for a desired temperature. Typically, the laser source or charged particle source can deliver at least two Watts of power to the tip, such as, for example, from two Watts to five Watts of power.

As yet a further example, while the tips of gas field ion sources has been described, tips for other ion sources may be produced using systems and methods disclosed herein. More generally, the tip of any charged particle source may be produced using systems and methods disclosed herein. For example, an electron source tip may be produced using systems and methods disclosed herein.

As another example, while embodiments have been described in which a support assembly includes two posts, in some embodiments, a different number of posts (e.g., three posts, four posts, five posts, six posts) can be attached to a base. Each post can be connected to the emitter through a corresponding heater wire.

As an additional example, while embodiments with certain designs for a support assembly have been provided, other designs may also be used. For example, in some embodiments, a support assembly can include a Vogel mount, which can be used to secure the emitter.

As a further example, while a tip having a W(111) orientation has been described, other tip orientations may be used. Examples include W(112), W(110) or W(100)).

As another example, while a tip apex having a terminal shelf with three atoms has been described, other tip apexes can be used. Examples include a tip apex having a terminal shelf with two atoms, four atoms, five atoms, six atoms, seven atoms, eight atoms, nine atoms, ten atoms, and more than ten atoms.

As yet another example, while embodiments have been described in which a W tip is used, tips formed other materials may be used. Examples of such materials include metals (e.g., tantalum (Ta), iridium (Ir), rhenium (Rh), niobium (Nb), platinum (Pt), molybdenum (Mo)) and alloys (e.g., alloys of one or more metals disclosed herein). Still different materials, such as carbon (C) may also be used.

Other embodiments are in the claims.

What is claimed is:

1. A system, comprising:
a gas field ion source comprising a tip having a tip apex, the tip apex being configured to emit ions during use of the gas field ion source, and the tip apex being capable of generating light when heated;
ion optics capable of forming an ion beam of ions emitted by the gas field ion source and delivering the ion beam to a sample region;
a detector configured to detect light generated by the tip apex; and
a controller coupled with the gas field ion source and the detector so that the controller can control heating of the tip apex based on the light detected by the detector,
wherein the system is configured so that:
in a first mode, the ions emitted by the tip apex are used to investigate and/or modify the sample region without detecting light generated by the tip apex;
in a second mode, to re-form the tip apex, the gas field ion source is heated and light emitted by the tip apex is detected; and
in the second mode, the system compares an amount of the detected light to an amount of light expected to be detected at a desired temperature of the tip apex to determine whether to change the heat delivered to the tip apex.

2. The system of claim 1, wherein the gas field ion source defining an optical axis along which a ion beam emitted by the gas field ion source propagates, and wherein the detector is disposed off the optical axis.

3. The system of claim 1, further comprising an optical device, wherein the light interacts with the optical device before being detected by the detector.

4. The system of claim 3, wherein the optical device directs the light to the detector.

5. The system of claim 3, wherein the optical device comprises an optical filter.

6. The system of claim 1, further comprising an aperture, wherein the light passes through the aperture before reaching the detector.

7. The system of claim 1, further comprising a power supply coupled to a resistive heating element that is configured to heat the tip apex when the resistive heating element is heated.

8. The system of claim 7, further comprising at least one sensor selected from the group consisting of a voltage sensor configured to measure a voltage across the resistive heating element, and/or a current sensor configured to measure an electrical current flowing through the resistive heating element.

9. The system of claim 1, further comprising a heat source configured to heat the tip apex, wherein the heat source is selected from the group consisting of a laser and an electron source.

10. The system of claim 9, wherein the heat source is configured to provide at least two Watts of heating power to the tip.

11. A method, comprising:
a) forming a tip apex of a tip of a gas field ion source;
b) using the tip apex of the tip of the gas field ion source to ions;
c), after b), re-forming the tip apex via a method comprising:
  i) heating the tip apex;
  ii) detecting light generated by the tip apex while the tip apex is heated;
  iii) determining whether to change the heat delivered to the tip apex based on the detected light by comparing an amount of the detected light to an amount of light expected to be detected at a desired temperature of the tip apex; and
  iv) changing a temperature of the tip apex in proportion to an amount of detected light, thereby providing a re-formed tip apex;
d) generating ions using the re-formed tip apex without detecting light emitted by the re-formed tip apex; and
e) using the ions to investigate and/or modify a sample.

12. The method of claim 11, further comprising using the comparison to change the heat delivered to the tip apex, wherein the heat delivered to the tip apex is changed if the comparison indicates that a differential between a first temperature and a second temperature is greater than a predetermined value, the first temperature is a temperature of the tip apex based on the detected light, and the second temperature is a desired temperature of the tip apex.

13. The method of claim 12, wherein the heat delivered to the tip apex is unchanged if the comparison indicates that a differential between a first temperature and a second temperature is less than a predetermined value, the first temperature is a temperature of the tip apex based on the detected light, and the second temperature of the tip apex is a desired temperature of the tip apex.

14. The method of claim 11, wherein:
determining whether to change the heat delivered to the tip apex comprises determining at least two parameters;
the at least two parameters are selected from the group consisting of an integral of a differential between a first temperature and a second temperature, a derivative of the differential between the first and second temperatures, and a proportion of the differential between the first and second temperatures;
the first temperature is a temperature of the tip apex based on the detected light; and
the second of the tip apex is a desired temperature of the tip apex.

15. A method for operating a gas field ion device, the gas field ion device comprising a gas field ion source having a tip, the method comprising:
operating the gas field ion device in a first mode of operation in which an ion beam generated by the gas field ion source is directed to a sample through ion optics to investigate and/or modify the sample, the first mode of operation being performed without detecting light emitted by the gas field ion source,
operating the gas field ion device in a second mode of operation to re-form the apex in which energy is applied to the tip of the gas field ion source,
detecting light emitted by the tip, and
controlling the energy applied to the tip based on the detected light emitted by the tip, wherein in the second mode, the system compares an amount of the detected light to an amount of light expected to be detected at a desired temperature of the tip apex to determine whether to change an amount of heat delivered to the tip apex.

16. The method of claim 15, wherein controlling the energy applied to the tip comprises determining that a differential between a first temperature and a second temperature is greater than a predetermined value, the first temperature is a temperature of the tip apex based on the detected light, and the second temperature is a desired temperature of the tip apex.

17. The method of claim 15, wherein the gas field ion device is in a housing held under a vacuum, and switching between the first mode of operation and the second mode of operation does not require venting the housing.

* * * * *